US010011899B2

(12) United States Patent
Ono et al.

(10) Patent No.: US 10,011,899 B2
(45) Date of Patent: Jul. 3, 2018

(54) DEPOSITION APPARATUS

(71) Applicant: CANON ANELVA CORPORATION, Kawasaki-shi, Kanagawa-ken (JP)

(72) Inventors: Teruaki Ono, Chofu (JP); Masahiro Shibamoto, Hachioji (JP)

(73) Assignee: CANON ANELVA CORPORATION, Kanagawa-ken (JP)

(*) Notice: Subject to any disclaimer, the term of this patent is extended or adjusted under 35 U.S.C. 154(b) by 166 days.

(21) Appl. No.: 14/938,513

(22) Filed: Nov. 11, 2015

(65) Prior Publication Data

US 2016/0060750 A1 Mar. 3, 2016

Related U.S. Application Data

(63) Continuation of application No. PCT/JP2014/000676, filed on Feb. 7, 2014.

(30) Foreign Application Priority Data

May 23, 2013 (JP) ................................. 2013-109378

(51) Int. Cl.
C23C 14/00 (2006.01)
C23C 14/32 (2006.01)
(Continued)

(52) U.S. Cl.
CPC .......... C23C 14/325 (2013.01); G11B 5/8408 (2013.01); H01J 37/32055 (2013.01);
(Continued)

(58) Field of Classification Search
CPC ................................................ H01J 37/32055
See application file for complete search history.

(56) References Cited

U.S. PATENT DOCUMENTS 6,026,763 A * 2/2000 Kim ...................... C23C 14/325
  118/723 HC
6,031,239 A * 2/2000 Shi ......................... C23C 14/221
  250/396 ML
(Continued)

FOREIGN PATENT DOCUMENTS

JP 2002-241927 A 8/2002
JP 2004-211127 A 7/2004
(Continued)

OTHER PUBLICATIONS

Notice of Allowance dated Dec. 2, 2015, by the Taiwanese Patent Office in corresponding Taiwanese Patent Application No. 103117770. (3 pages).
(Continued)

Primary Examiner — Timon Wanga
(74) Attorney, Agent, or Firm — Buchanan Ingersoll & Rooney PC

(57) ABSTRACT

A deposition apparatus comprises a target unit, an anode unit into which electrons emitted from the target unit flow, a striker configured to come into contact with the target unit to render the target unit and the anode unit conductive, so as to cause arc discharge between the target unit and the anode unit, a striker driving unit configured to drive the striker in one of a direction toward the target unit and a direction to retract from the target unit, a power supply unit configured to supply power to the target unit and the anode unit, and a control unit configured to control the striker driving unit and the power supply unit. The control unit supplies the power to the target unit and the anode unit after bringing the striker into contact with the target unit.

7 Claims, 9 Drawing Sheets

(51) Int. Cl.
  *G11B 5/84* (2006.01)
  *H01J 37/32* (2006.01)
(52) U.S. Cl.
  CPC .... *H01J 37/32064* (2013.01); *H01J 37/3266* (2013.01); *H01J 37/32614* (2013.01); *H01J 37/32669* (2013.01)

(56) References Cited

U.S. PATENT DOCUMENTS

2004/0124080 A1   7/2004  Murakami et al.
2004/0137725 A1   7/2004  Cheah et al.

FOREIGN PATENT DOCUMENTS

| | | |
|---|---|---|
| JP | 2004-218087 A | 8/2004 |
| JP | 2007-254770 A | 10/2007 |
| TW | 200846486 A | 12/2008 |

OTHER PUBLICATIONS

International Search Report (PCT/ISA/210) dated Apr. 28, 2014, by the Japanese Patent Office as the International Searching Authority for International Application No. PCT/JP2014/000676.
Written Opinion (PCT/ISA/237) dated Apr. 28, 2014, by the Japanese Patent Office as the International Searching Authority for International Application No. PCT/JP2014/000676.

\* cited by examiner

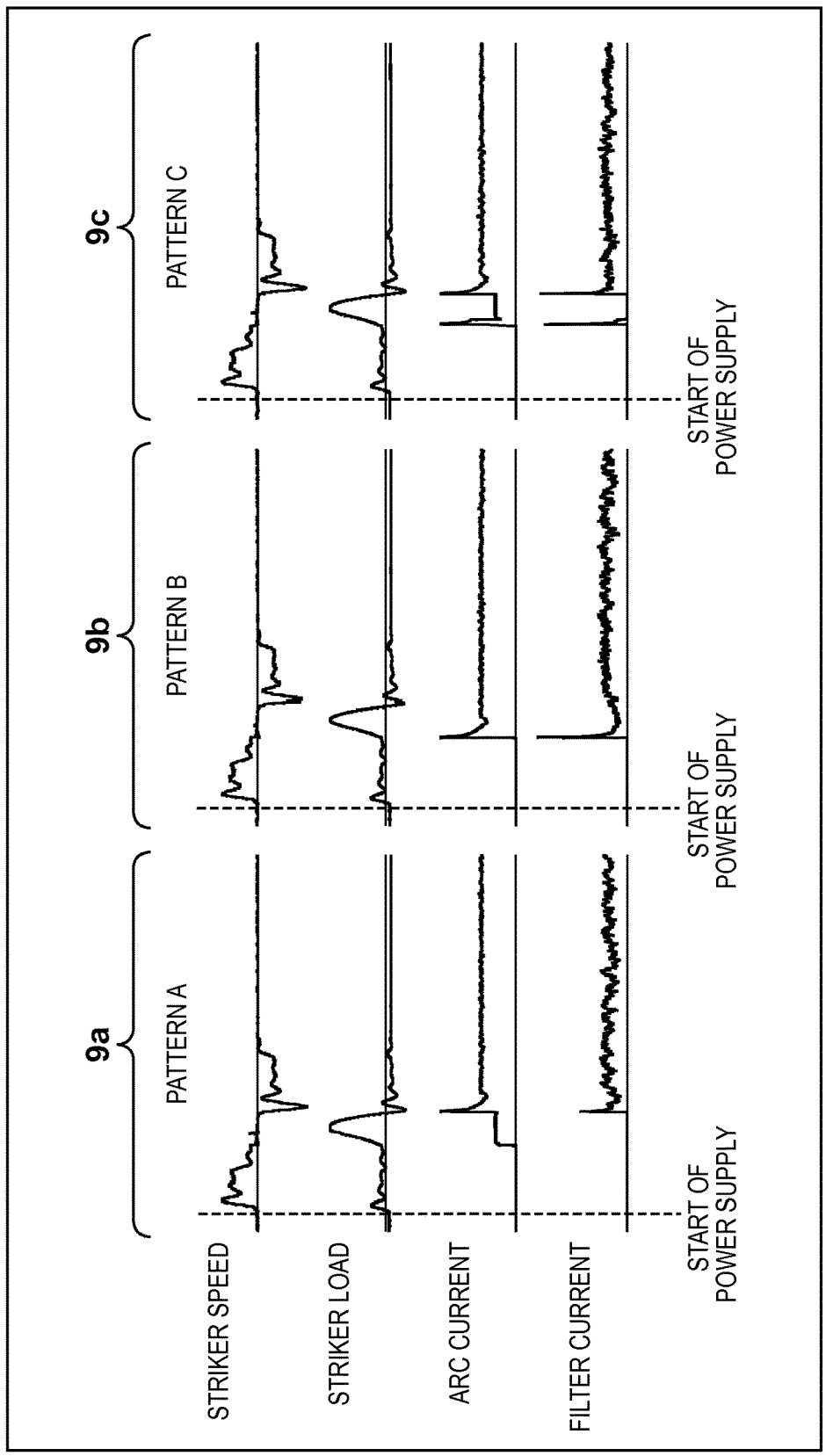

DEPOSITION APPARATUS

This application is a continuation of International Patent Application No. PCT/JP2014/000676 filed on Feb. 7, 2014, and claims priority to Japanese Patent Application No. 2013-109378 filed on May 23, 2013, the entire content of both of which is incorporated herein by reference.

TECHNICAL FIELD

The present invention relates to a deposition apparatus that uses arc discharge.

BACKGROUND ART

As a method of forming a protective film for a medium such as a hard disk, there is CVD using a reactive gas such as $C_2H_2$ of $C_2H_4$. In recent years, to shorten the spacing distance or head floating amount between a magnetic read head and the magnetic recording layer of a medium and improve the drive characteristic, a protective film of carbon or the like deposited on the magnetic recording layer also needs to be thinner.

However, the thinness of a carbon protective film deposited by CVD is said to be limited to 2 to 3 nm because of its characteristic. As a technique that replaces CVD, a deposition method (Vacuum Arc Deposition) using arc discharge, which can form a thinner carbon protective film, has received attention. Since the vacuum arc deposition can form a hard carbon protective film with a small hydrogen content as compared to CVD, it may be possible to reduce the film thickness to about 1 nm.

For example, Patent Document 1 describes a deposition apparatus including a striker configured to form an arc spot on a target and make the target emit target ions and electrons by arc discharge, an anode unit configured to maintain an arc, an anode coil configured to form a flow of electrons between the target and the anode unit, and a filter unit configured to guide the target ions and electrons to a process chamber.

PRIOR ART DOCUMENT

Patent Document

Patent Document 1: Japanese Patent Laid-Open No. 2007-254770

SUMMARY OF INVENTION

Problems that the Invention is to Solve

In the conventional vacuum arc deposition, as shown in FIG. 8, when an operation start signal is output (step S801), power supply by an arc power source starts, and simultaneously, the striker starts moving in a direction toward the target (step S802). Upon detecting that the striker has come into contact with the target (step S803), the striker starts moving to a retracting position (step S804). An arc is generated somewhere in the series of operations. The arc discharge is maintained by power supplied from the arc power source. When reaching a desired time, power supply by the arc power source ends (steps S805 and S806).

A result obtained by the present inventors' examination of a conventional arc generation pattern will be explained here. 9*a* to 9*c* in FIG. 9 show striker speeds, striker loads, arc currents, and filter currents in three patterns A to C. The striker speeds and the striker loads were measured by a striker driving motor, the arc currents were measured by an arc power source, and the filter currents were measured by a filter power source or a current measurement means. Generation of an arc can be confirmed by the filter current that is generated when electrons or target ions from the plasma flow into the filter unit at the time of plasma generation by the arc. The present inventors found that there are three patterns A to C as the conventional arc generation patterns. That is, there exist a pattern A that is generated when the striker retracts from the target, a pattern B that is generated immediately after the striker comes into contact with the target, and a pattern C that is generated immediately after the striker comes into contact with the target but disappears due to some reasons, and is generated again when the striker retracts from the target. The existence of the plurality of arc generation patterns means that a variation in film thickness between processing target substrates occurs.

The present invention has been made in consideration of the above-described problem, and has as its object to realize a deposition apparatus capable of reducing a variation in film thickness between processing targets as compared to before by controlling an arc generation timing.

Means for Solving the Problems

In order to solve the above problem and achieve the object, a deposition apparatus according to the present invention comprises: a target unit; an anode unit into which electrons emitted from the target unit flow; a striker configured to come into contact with the target unit to render the target unit and the anode unit conductive, so as to cause arc discharge between the target unit and the anode unit; a striker driving unit configured to drive the striker in one of a direction toward the target unit and a direction to retract from the target unit; a power supply unit configured to supply power to the target unit and the anode unit; and a control unit configured to control the striker driving unit and the power supply unit, wherein the control unit supplies the power to the target unit and the anode unit after bringing the striker into contact with the target unit.

Effects of the Invention

According to the present invention, it is possible to reduce a variation in film thickness between processing targets as compared to before by controlling an arc generation timing.

Other features and advantages of the present invention will be apparent from the following descriptions taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 9 is a view showing arc generation patterns by the conventional deposition apparatus.

DESCRIPTION OF EMBODIMENTS

Preferred embodiments of the present invention will now be described in detail with reference to the accompanying drawings. Note that the constituent elements described in the embodiments are merely examples. The technical scope of the present invention is determined by the scope of claims and is not limited by the following individual embodiments.

An embodiment in which a deposition apparatus according to the present invention is applied to a deposition apparatus for forming a protective film on a substrate as a processing target using vacuum arc deposition will be described below.

<Apparatus Configuration>

The configuration of a deposition apparatus according to an embodiment of the present invention will be described with reference to FIGS. 1 to 3A to 3C.

Figure 1:
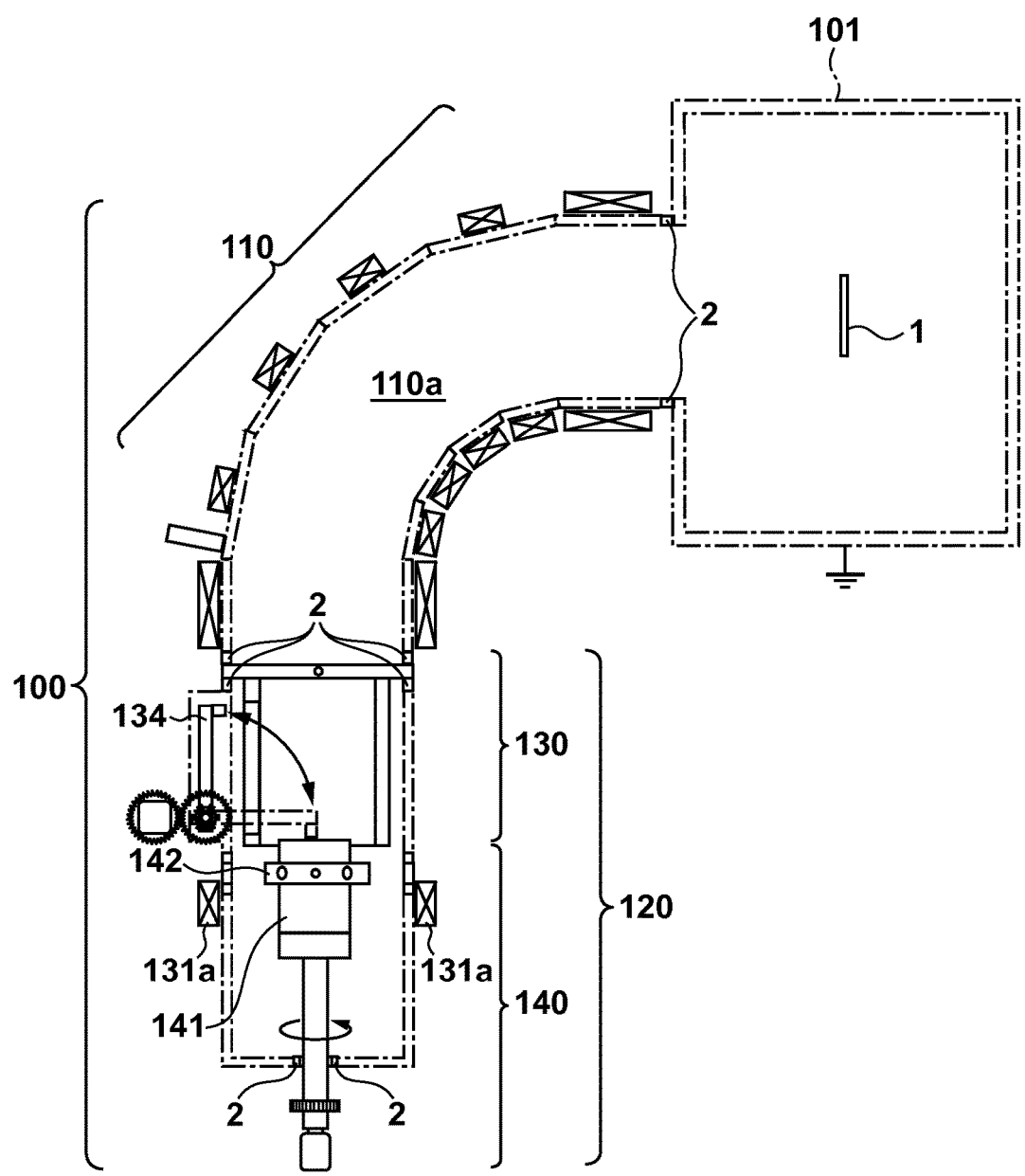
FIG. 1 is a sectional view showing the schematic configuration of a deposition apparatus according to an embodiment of the present invention.
Figure 2:
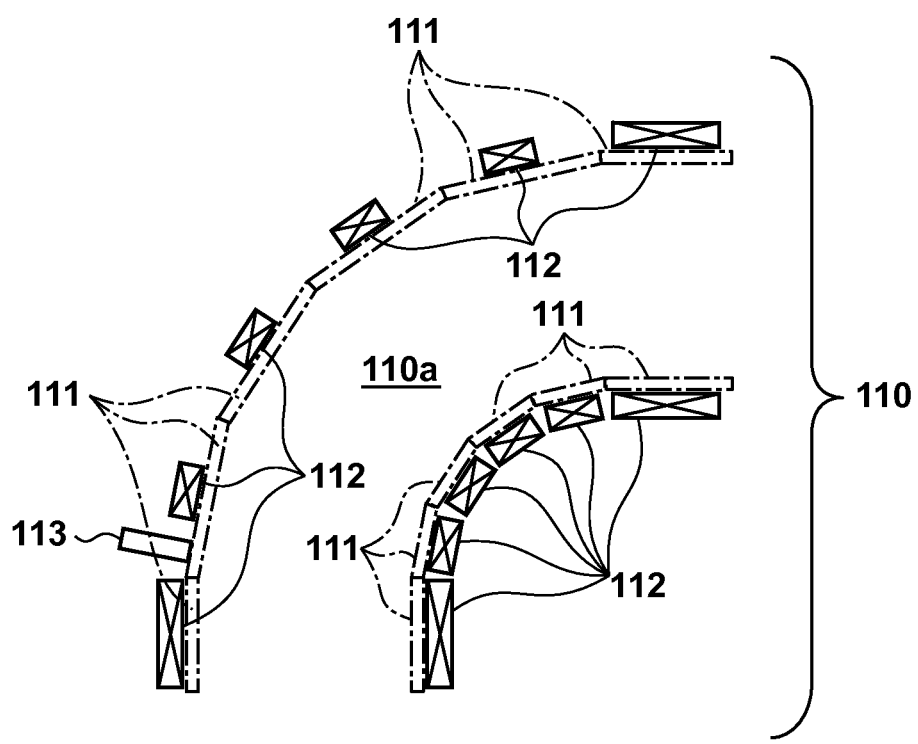
FIG. 2 is a sectional view showing the configuration of the filter unit of the deposition apparatus shown in FIG. 1.

Referring to FIG. 1, a deposition apparatus 100 according to this embodiment includes a process chamber 101 where a substrate 1 on which a protective film of a target material (for example, carbon) having a thickness of 3 nm or less is to be formed is arranged, a filter unit 110 connected so as to internally communicate with the process chamber 101, and a source unit 120 connected so as to internally communicate with the filter unit 110. An insulating member 2 is arranged at each of connection portions between the process chamber 101 and the filter unit 110 and that between the filter unit 110 and the source unit 120 so that each unit holds an electrically insulated state.

The filter unit 110 forms a guide path 110a bent in a 90° direction, and includes one or more transport tubes 111 configured to hold a vacuum state in the guide path 110a, a filter coil 112 that forms a magnetic field to transport electrons and target ions to the atmospheric side or vacuum side of the transport tube 111, and a magnetic field forming means such as a permanent magnet. The guide path 110a is formed by connecting the one or more transport tubes 111. The filter coil 112 is provided around the outside (atmospheric side) of each transport tube 111 to guide electrons and target ions generated in the source unit 120 to the substrate 1 and remove carbon particles with a large grain size. The transport tube 111 is provided with a voltage application means such as a voltage application terminal 113. If there are two or more transport tubes 111, each transport tube is rendered electrically conductive, or an insulating member is arranged at each connecting portion to attain an electrically insulated state. Either state can be selected.

The source unit 120 includes an anode unit 130, a cathode target unit 140, and an anode coil 131a. An electron current or ion current between the anode unit 130 and the cathode target unit 140 is maintained, thereby maintaining arc discharge.

Figure 3A:
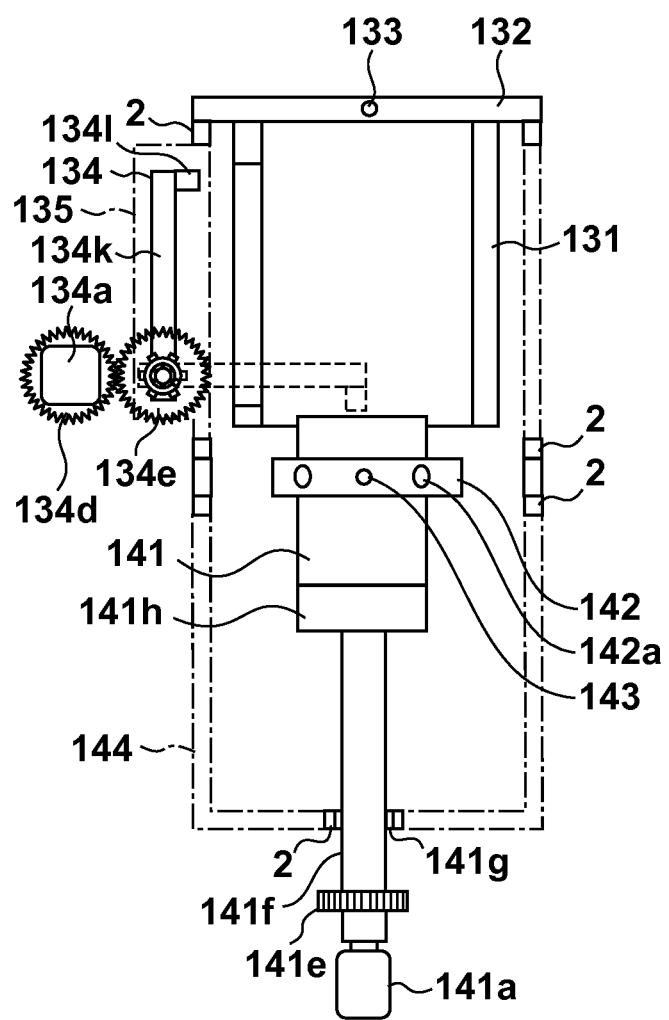
FIG. 3A is a side view showing the configuration of the source unit of the deposition apparatus shown in FIG. 1, which is viewed from two directions.
Figure 3B:
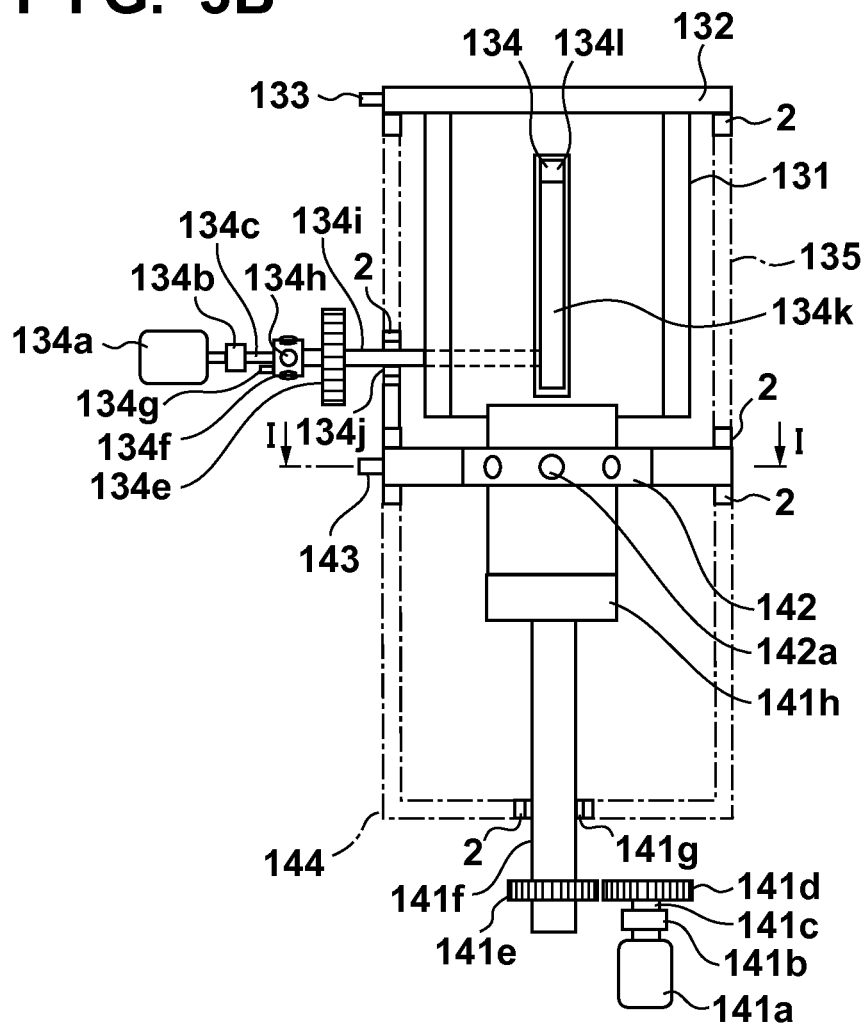
FIG. 3B is a side view showing the configuration of the source unit of the deposition apparatus shown in FIG. 1, which is viewed from two directions.
Figure 3C:
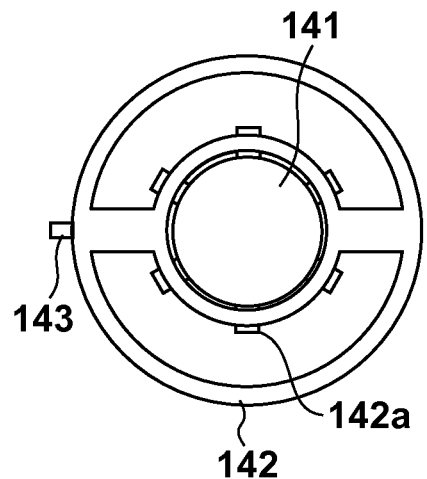
FIG. 3C is a sectional view taken along a line I-I in FIG. 3B.

The anode unit 130 includes an anode 131, an anode feed portion 132, an anode feed terminal 133, a striker 134, and an anode housing 135, as shown in FIGS. 3A to 3C in detail.

The striker 134 comes into contact with the surface of the cathode target unit 140 at a predetermined timing, thereby causing arc discharge on the target surface. Electrons and target ions emitted from an arc spot on the cathode target unit 140 are changed to a plasma and guided to the process chamber 101. The cathode target unit 140 is rotated to a predetermined angle. The position where the striker 134 comes into contact with the cathode target unit 140 is relatively moved in this way, thereby preventing arc spots from localizing. Note that the arc spot is the place on the target where an arc is generated.

The striker 134 is equipotential to the anode 131. The insulating member 2 is placed between the anode housing 135 and the anode feed portion 132 to hold an electrically insulated state between them. The striker 134 is configured to be driven by transmitting the driving force of a striker driving motor 134a via a striker driving motor coupling 134b, a striker driving motor shaft 134c, a striker driving motor gear 134d, a striker driving motor power transmission gear 134e, and a striker feed/driving shaft 134i. A striker feed terminal 134g, a striker feed portion 134f, and a striker feed brush 134h are connected to the striker feed/driving shaft 134i, and the striker feed brush 134h is arranged so as to come into contact with the striker feed/driving shaft, thereby feeding the striker 134. The insulating member 2 is placed between the striker feed/driving shaft 134i and the anode housing 135 to hold an electrically insulated state between them. In addition, a magnetic fluid 134j is placed between the insulating member 2 and the striker feed/driving shaft 134i. It is therefore possible to drive and feed the striker 134 without rendering the striker feed/driving shaft 134i and the anode housing 135 conductive.

The striker 134 is formed from an arm portion 134k and a tip portion 134l which are preferably made of a material having durability to withstand a high temperature/large current. For example, the arm portion 134k is made of molybdenum, and the tip portion 134l is made of graphite. The arm portion and the tip portion may integrally be formed.

The cathode target unit 140 includes a cylindrical or disc-shaped cathode target 141 made of carbon graphite, a cathode target feed portion 142, a cathode target feed terminal 143, and a cathode target housing 144. The cathode target 141 is configured to be rotatable by transmitting the driving force of a cathode target rotation motor 141a via a cathode target rotation motor coupling 141b, a cathode target rotation motor shaft 141c, a cathode target rotation motor gear 141d, a cathode target rotation motor power transmission gear 141e, a cathode target rotation shaft 141f, and a cathode target bracket 141h. The cathode target 141 is connected to the cathode target feed portion 142, a cathode target feed brush 142a, and the cathode target feed terminal 143 so as to be fed. The insulating member 2 is placed between the cathode target rotation shaft 141f and the cathode target housing 144 to hold an electrically insulated state between them. In addition, a magnetic fluid 141g is placed between the insulating member 2 and the cathode target rotation shaft 141f. It is therefore possible to rotate and feed the cathode target 141 without rendering the cathode target rotation shaft 141f and the cathode target housing 144 conductive.

In the above configuration, when the striker 134 comes into contact with the cathode target 141, the anode 131 and the cathode target 141 short-circuit, and an arc is generated.

When a negative voltage is applied from an arc power source (not shown) to the cathode target 141, and a positive voltage is applied to the striker 134 and the anode 131, a flow of electrons is formed between the cathode target 141 and the anode 131 along a magnetic field generated by the anode coil 131a.

Electrons generated in the arc spot become arc maintaining electrons and ion transport electrons. The arc maintaining electrons are some of electrons generated on the target surface, which are guided by the magnetic field of the anode coil 131a and flow into the anode 131. The arc maintaining electrons are used to supply a current between the cathode target 141 and the anode 131 to heat the arc spot.

The ion transport electrons are electrons used to make the target ions reach the processing target substrate 1, and have a function of attracting ions using the Coulomb force of the electrons. The ion transport electrons are guided in a direction toward the processing target substrate 1 by the magnetic field generated by the filter unit 110.

With the above-described configuration, target ions are adhered/deposited on the surface of the processing target substrate 1 in the process chamber 101, thereby depositing a protective film.

<Power Supply System>

Figure 4:
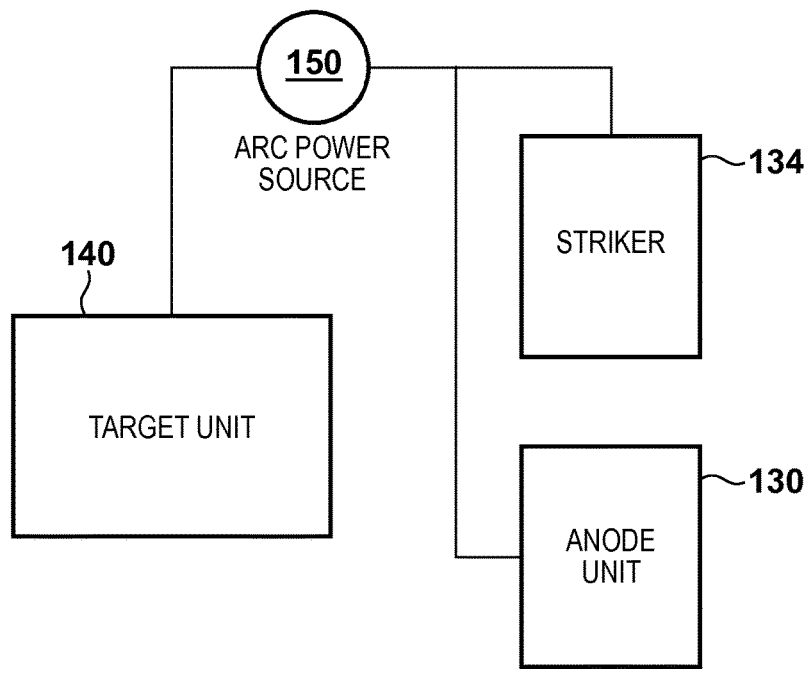
FIG. 4 is a block diagram showing the schematic configuration of the power supply system of the deposition apparatus according to the embodiment.

The configuration of the power supply system of the deposition apparatus according to this embodiment will be described next with reference to FIG. 4 as well.

The process chamber 101 is connected to ground. The filter unit 110 is connected to a filer power source or current measurement unit (not shown) via the voltage application terminal 113. The anode unit 130 is connected to an arc power source 150 via the anode feed terminal 133. The striker 134 is connected to the arc power source 150 via the striker feed terminal 134g. The cathode target unit 140 is connected to the negative electrode side of the arc power source 150 via the cathode target feed terminal 143. The anode unit 130 and the striker 134 are connected to the positive side of the arc power source 150 so as to be equipotential. The cathode target unit 140 is connected to the negative side of the arc power source 150. The arc power source 150 preferably performs current supply control but may do voltage application control. In this specification, the current and voltage will generically be referred to as power.

Note that since any circuit configured to generate a potential difference between the side of the anode unit 130 and the cathode target unit 140 can cause arc discharge between the side of the anode unit 130 and the cathode target unit 140, the circuit may be formed using a plurality of power supplies. For example, the circuit may connect one terminal of a first power source to ground and the other terminal to the side of the anode unit 130, and connect one terminal of a second power source to the cathode target unit 140 and the other terminal to ground.

The striker 134 according to this embodiment is connected to the arc power source 150 in parallel to the anode unit 130. However, a series wiring that connects the striker 134 to the anode unit 130 may be employed. If power supplied to the striker 134 and that to the anode unit 130 are substantially equal, the power source for supplying power to the striker 134 and the power source for supplying power to the anode unit 130 may be separated. In this embodiment, when supplying power to the anode unit 130 to generate an arc, the power is also supplied to the striker 134.

<Control System>

The schematic configuration of the control system of the deposition apparatus according to this embodiment will be described next with reference to FIG. 5.

Figure 5:
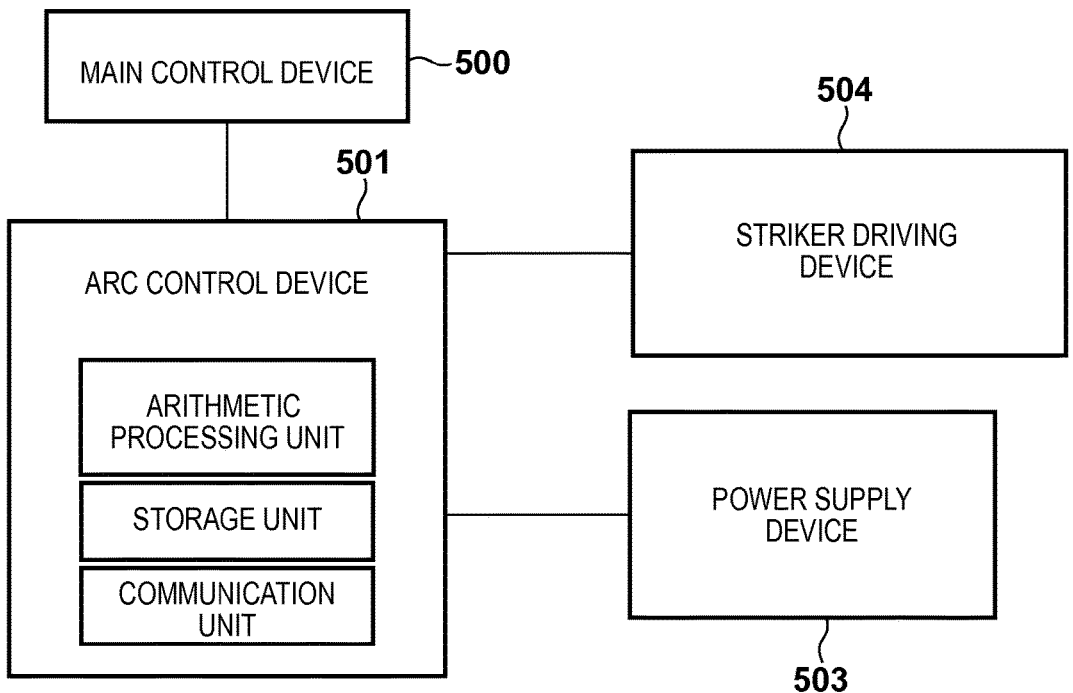
FIG. 5 is a block diagram showing the schematic configuration of the control system of the deposition apparatus according to the embodiment.

As shown in FIG. 5, the deposition apparatus according to this embodiment includes a main control device 500 configured to generally control the entire apparatus, and an arc control device 501 configured to control generation of an arc. Each of the main control device 500 and the arc control device 501 includes a storage unit such as a memory, an arithmetic processing unit such as a CPU, and a communication unit. The arc control device 501 controls power supply of the arc power source 150 serving as a power supply device 503 in accordance with a control signal received from the main control device 500, and also controls rotation of the motors 134a and 141a serving as a striker driving device 504. Note that the power supply device 503 includes a resistance meter configured to measure the resistance value between the striker 134 and the cathode target unit 140. The striker driving device 504 includes a sensor such as an encoder configured to detect the rotation speed or torque of the striker driving motor 134a or the cathode target rotation motor 141a of the cathode target unit 140.

<Arc Generation Timing Control Processing>

Arc generation timing control processing of the deposition apparatus according to this embodiment will be described next with reference to FIG. 6.

When an operation start signal is output from the main control device 500 (step S601), processing by the arc control device 501 starts. Even when the operation start signal is output, the arc power source 150 does not start power supply, and driving of the striker 134 in the direction to come into contact with the cathode target 141 starts (step S602).

After that, upon detecting that the striker 134 has come into contact with the cathode target 141 (step S603), the arc control device 501 starts power supply by the arc power source 150 (step S604).

After that, driving of the striker 134 in the direction to retract from the cathode target 141 starts (step S605).

Upon detecting that the striker 134 has reached the retracting position (step S606), the arc control device 501 stops power supply by the arc power source 150 (step S607).

The above-described operation is repetitively performed for each processing target substrate.

Note that the contact between the striker 134 and the cathode target 141 can be determined by detecting a load by a reaction force that the striker 134 receives. That is, when the load of the striker driving motor 134a exceeds a predetermined threshold, it is determined that the striker 134 has come into contact with the cathode target 141.

As another method, when the moving speed of the striker 134 falls to a predetermined threshold or less, or when the electrical resistance value between the striker 134 and the cathode target 141 falls to a predetermined threshold or less, it may be determined that the striker 134 has come into contact with the cathode target 141.

In this embodiment, after the striker 134 has come into contact with the cathode target 141, power supply is started, and the striker 134 is retracted. However, power supply may be performed during the time until the striker 134 that is in contact with the cathode target 141 changes to a non-contact state. In addition, driving of the striker 134 to the retracting position may be started after the elapse of a predetermined time since the striker 134 came into contact with the cathode target 141.

Figure 6:
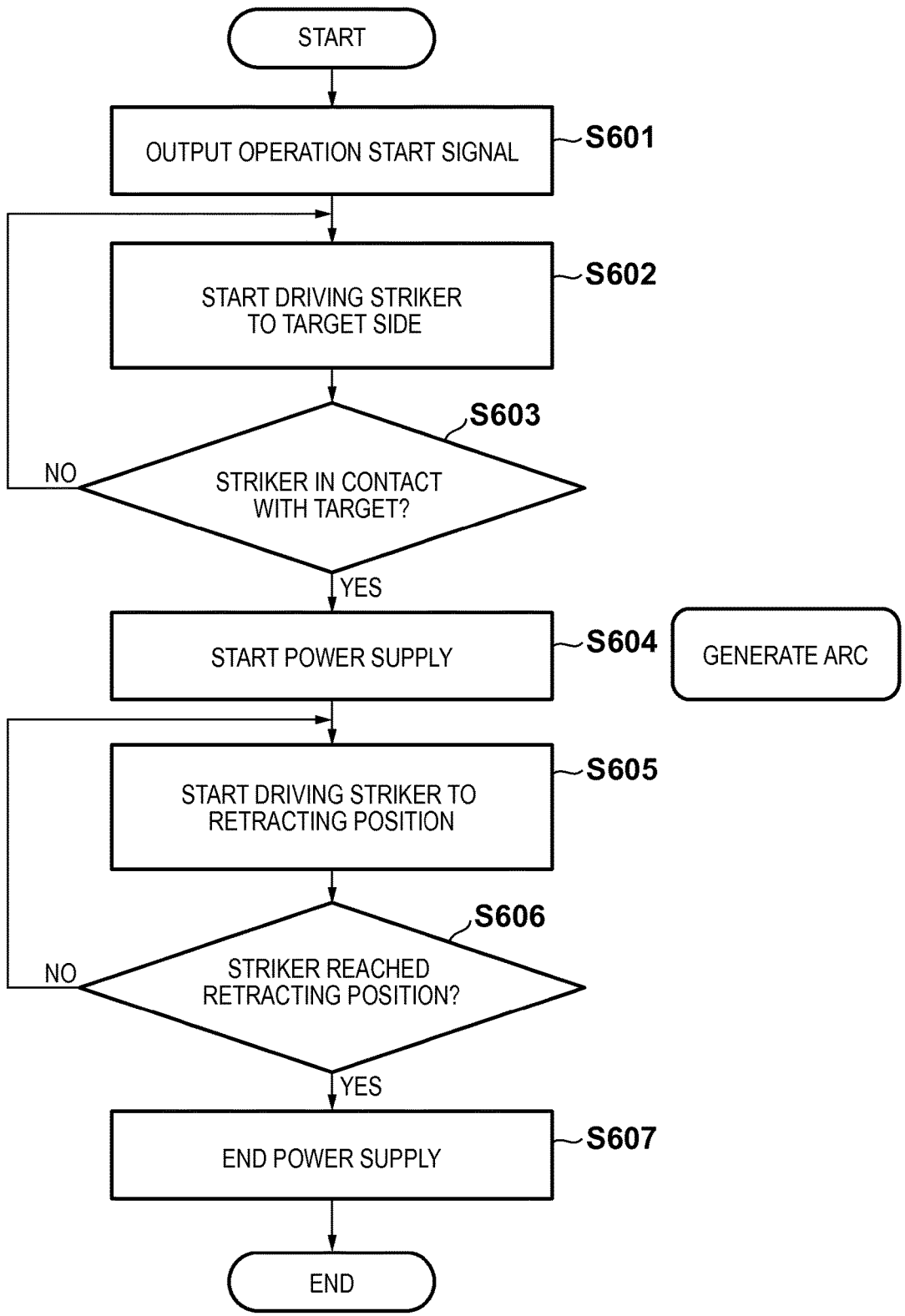
FIG. 6 is a flowchart showing the arc generation processing procedure of the deposition apparatus according to the embodiment.
Figure 7:
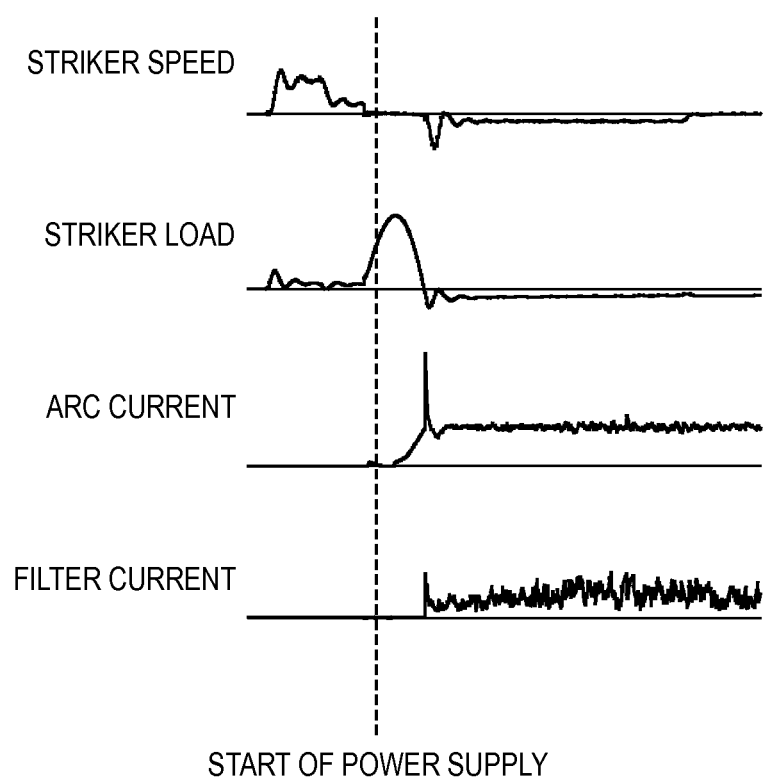
FIG. 7 is a view showing an arc generation pattern by the deposition apparatus according to the embodiment.
Figure 8:
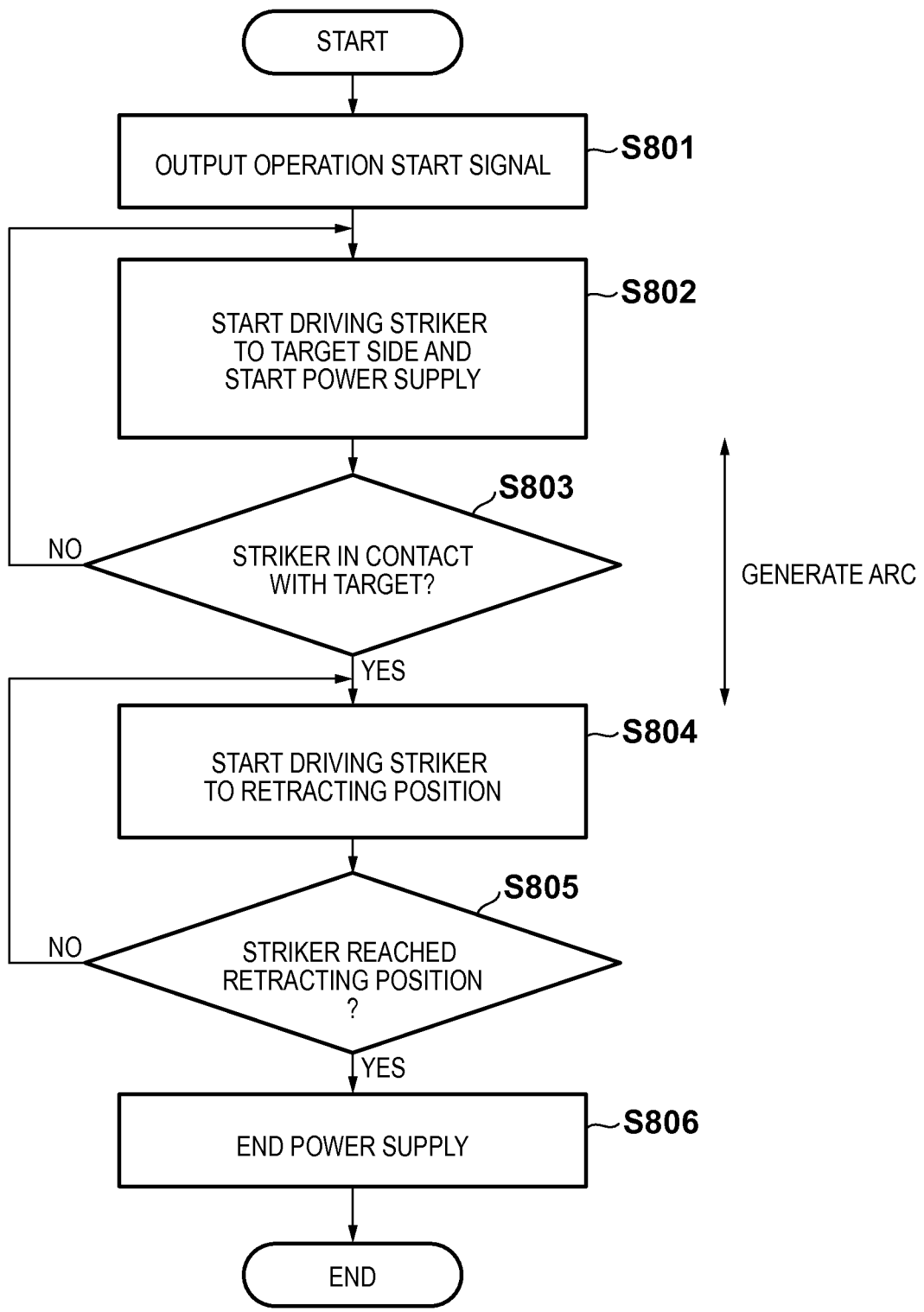
FIG. 8 is a flowchart showing the arc generation processing procedure of a conventional deposition apparatus.

FIG. 7 shows a result obtained by examining arc generation patterns by arc generation timing control shown in FIG. 6. It was confirmed that there is only a pattern generated when the striker 134 retracts from the cathode target 141.

As described above, according to this embodiment, control is performed to generate an arc after the striker is brought into contact with the cathode target, thereby reducing a variation in film thickness between processing target substrates as compared to before.

Note that in the above-described embodiment, a form in which carbon is used as the target material has been described. However, the material is not limited to carbon, and for example, Ti or TiN is also usable.

The present invention is not limited to the above embodiments, and various changes and modifications can be made within the spirit and scope of the present invention. Therefore, to apprise the public of the scope of the present invention, the following claims are made.

What is claimed is:

1. A deposition apparatus comprising:
   a target unit;
   an anode unit into which electrons emitted from the target unit flow;
   a striker configured to come into contact with the target unit to render the target unit and the anode unit conductive, so as to cause arc discharge between the target unit and the anode unit;
   a striker driving unit configured to drive the striker in one of a direction toward the target unit and a direction to retract from the target unit;
   a power supply unit configured to supply power to the target unit and the anode unit;
   a detector configured to detect that the striker is in contact with the target unit; and
   a controller configured to control the striker driving unit to bring the striker into contact with the target unit, and to control the power supply unit to start supplying the power to the target unit and the anode unit after the detector detects that the striker contacts the target unit.

2. The deposition apparatus according to claim 1, wherein the controller is further configured to control the power supply unit to supply the power during a time until the detector detects that the striker that is in contact with the target unit changes to a non-contact state.

3. The deposition apparatus according to claim 1, wherein the controller is further configured to determine that the striker contacts the target unit when a load on the striker detected by the detector exceeds a predetermined threshold.

4. The deposition apparatus according to claim 1, wherein the controller is further configured to determine that the striker contacts the target unit when a resistance value between the striker and the target unit detected by the detector is not more than a predetermined threshold.

5. The deposition apparatus according to claim 1, wherein the controller is further configured to determine that the striker contacts the target unit when a moving speed of the striker detected by the detector is not more than a predetermined threshold.

6. The deposition apparatus according to claim 1, wherein the power supply unit supplies the power by supplying a current or applying a voltage.

7. The deposition apparatus according to claim 1, further comprising a filter unit connected to the anode unit and configured to guide electrons emitted from the target unit in a direction toward a processing target.

* * * * *